(12) United States Patent
Kazakov et al.

(10) Patent No.: US 7,274,263 B2
(45) Date of Patent: Sep. 25, 2007

(54) MICROSTRIP STABILIZED QUANTUM WELL RESONANCE-TUNNELING GENERATOR FOR MILLIMETER AND SUBMILLIMETER WAVELENGTH RANGE

(75) Inventors: Igor Petrovich Kazakov, Moscow (RU); Alexander Lvovich Karuzsky, Moscow (RU); Yury Alekseevich Mityagin, Moscow (RU); Vladimir Nikolaevich Murzin, Moscow (RU); Andrey Michaylovich Tshovrebov, Moscow (RU)

(73) Assignees: Samsung Electronics Co., Ltd., Suwon (KR); Institute of Lebedev Physical Institute of Russian Academy of Science (RU)

( * ) Notice: Subject to any disclaimer, the term of this patent is extended or adjusted under 35 U.S.C. 154(b) by 90 days.

(21) Appl. No.: 11/210,751

(22) Filed: Aug. 25, 2005

(65) Prior Publication Data

US 2006/0055476 A1    Mar. 16, 2006

(30) Foreign Application Priority Data

Aug. 25, 2004 (RU) ............................. 2004125910
Jul. 12, 2005 (KR) ..................... 10-2005-0062965

(51) Int. Cl.
*H03B 5/18* (2006.01)
(52) U.S. Cl. ........................... 331/107 SL; 331/117 D
(58) Field of Classification Search ........... 331/107 SL
See application file for complete search history.

(56) References Cited

U.S. PATENT DOCUMENTS 5,675,295 A * 10/1997 Brebels et al. .............. 331/105

* cited by examiner

*Primary Examiner*—Joseph Chang
(74) *Attorney, Agent, or Firm*—Sughrue Mion, PLLC

(57) ABSTRACT

A microstrip stabilized quantum well resonance-tunneling generator which generates electromagnetic waves for millimeter and submillimeter wavelength range is provided The generator includes a resonant tunneling semiconductor quantum well diode, and a microstrip resonator. The resonant tunneling diode, the microstrip resonator and interconnecting lines and junctions are fabricated as a monolithic integrated device on a common substrate. As a result, the monolithic integrated device provides the expansion of the operation frequency range toward the terahertz region as a result of reduction of the parasitic inductance as well as of minimizing the other parasitic parameters of the electric circuitry connecting the resonant tunneling diode and resonator.

6 Claims, 3 Drawing Sheets

MICROSTRIP STABILIZED QUANTUM WELL RESONANCE-TUNNELING GENERATOR FOR MILLIMETER AND SUBMILLIMETER WAVELENGTH RANGE

CROSS-REFERENCE TO RELATED APPLICATION

This application claims priority from Russian Patent Application No. 2004125910 filed Aug. 25, 2004 in the State Patent Office of the Russian Federation, and Korean Patent Application No. 2005-62965 filed Jul. 12, 2005 in the Korean Intellectual Property Office, the entire contents of which are incorporated herein by reference.

BACKGROUND OF THE INVENTION

1. Field of the Invention

The present invention relates to the fields of microwave signal sources, solid state high-frequency electronics and microelectronics. More particularly, the present invention relates to a microstrip stabilized quantum well resonance-tunneling generator which generates electromagnetic waves of millimeter and submillimeter wavelength range.

2. Description of the Prior Art

Quantum effects including resonant tunneling effects are widely used in modern solid state and semiconductor electronics for application in the fields of communications, radiovision, introscopy, molecular spectroscopy, Earth atmosphere monitoring, and astrophysics, medicine and biology. The resonant-tunneling coupled quantum well diode structures were found to be the most promising to operate at terahertz frequencies since the tunneling charge transfer processes are extremely fast (see, e.g., U.S. Pat. No. 4,745,452).

Nevertheless, the expansion of operation frequencies of the resonant tunneling diode based generators towards the terahertz range is a problem of considerable complexity. The main reasons are fast increase of the energy losses at higher frequencies, difficulties in fabrication of the small size resonator systems, the increasing role of parasitic inductance and other parameters of the circuitry connecting an active element with an external resonator system.

Microwave generators based on the resonant tunneling quantum well diode structures with millimeter-band oscillation frequencies of 200, 420 and 720 GHz at room temperature were discloses in: E. R. Brown, T. C. L. G. Sollner et al., J. Appl. Phys. 64(3), 1519-1529 (1988), Appl. Phys. Lett. 55(17), 1777-1779 (1989), Appl. Phys. Lett. 58(20), 2291-2293 (1991).

The resonant tunneling diodes consisted of two AlAs barriers separated by a quantum well of GaAs (or InAs). The resonator structures used to obtain the oscillations were rectangular metallic waveguides with dimensions dependent on the oscillation frequency. A highest oscillation frequency of 712 GHz was obtained with a 0.030×0.015 $cm^2$ rectangular waveguide resonator. The DC bias was provided by a coaxial line with a whisker contact, wherein the coaxial line served to stabilize the diode at all frequencies below the band of interest, the whisker contact served to decrease the electric losses in coupling the electrical circuit. The highest power generated was about 0.3 µW.

The oscillation frequency was determined by the equivalent circuit impedance, including the equivalent parameters of the diode itself (the difference conductance, the frequency-dependent series resistance, the diode capacitance and the quantum well inductance) as well as external electric circuit parameters. To improve the high frequency characteristics of the device, the in-plane dimensions of the diode were made less than 2 microns. The technological difficulties of the fabrication of the small size rectangular waveguide resonators as well as fast decrease of its high-frequency characteristics restrict the possibilities of wide application of this type of devices.

Microstrip resonators, processing an intermediate position between confined cavity waveguide resonator systems used in microwave radiophysics and open cavity resonators used in optics, are widely used in high-frequency electronics.

These resonators are made of planar materials that allows low cost manufacturing processes and wide variation of its dimensions. It is important that microstrip lines may be integrated into the hybrid integrated circuits with the use of conventional thin-film technology. The resonator quality factor Q may be made rather high in high-frequency range, in particular, by the use of more complicated construction of the planar resonator. An example of such a high-Q resonator is disclosed in U.S. Pat. No. 5,825,266.

Another way of improving Q is to use high-Tc superconductors as a microstrip material. An example of such a high-Q resonator is disclosed in U.S. Pat. No. 6,021,337. A thickness of a superconducting coating placed on a dielectric layer in such a device exceeds one micron and may be a hundred of microns, thus allowing sufficient penetration of an electromagnetic field into the superconductor. At high frequencies, the application of striplines is limited by parameters of dielectrics, by an increase of the energy losses and an appearance of unwanted modes of oscillation.

"Microstrip Stablized Semiconductor Asymmetrical Quantum Well Structure Generator for Millimeter and Submillimeter Wavelength Range", A. A. Beloushkin et al., Superlattices and Microstructures, Vol. 22, No. 1, p. 19-23 (1997), discloses a device which combines the advantages of resonant-tunneling diodes and microstrip lines used as a microwave resonator. A resonant-tunneling quantum well structure was theoretically designed on the basis of self-consisted computer simulation and grown by molecular beam epitaxy (MBE) on a semi-insulated wafer of GaAs. The structure consisting of two 4.5 nm AlAs barriers, divided by a single 4.0 nm GaAs quantum well, includes spacer layers preventing impurity segregation out of heavily doped contact layers into an active quantum zone.

The system of coplanar contacts provided a minimum time delay in a negative differential conductivity (NDC) region of a current-voltage (I-V) curve due to a decrease of a capacitance and a series resistance of the device. The contact areas composed of the heavily doped GaAs and of the Cr/Au ohmic contacts were formed by vacuum deposition on the mesas of 0.01-0.025 mm in diameter. The microstrip resonator was designed as quarter wave T-coupled microstrip line with one end short-circuited. The Cu strips were patterned on a 1.5-mm-thick dielectric substrate (Teflon) with double-plane metallization. The line had a width of 2 mm and a length of 70 mm. The resonant tunneling diode was connected to resonator by short metallic conductors configured to provide a minimum level of inductive and resistive parasitic parameters. A room temperature microwave generation was achieved at frequency range 1-10 GHz with double barrier resonant tunneling diode as an active element (microwave power of 0.01-0.1 mW).

The efficiency of the use of a microstrip resonator in a shorter wavelength range is determined in a considerable degree by the quality of the wave impedance matching of the active element (resonant tunneling diode) and resonator.

This matching is difficult to achieve when the active element and the microstrip resonator are fabricated separately, as was the case in the disclosed device.

SUMMARY OF THE INVENTION

The present invention increases the oscillation frequency of solid state microwave generator towards the terahertz frequency range.

A monolithic integrated construction of the generator device of the present invention allows the application of the methods of molecular beam epitaxy and thin-film epitaxy. The present invention allows achievement of a minimum level of electrical losses and an optimal wave impedance matching system in short millimeter wavelength range. A high speed of the resonant tunneling diodes combined with the possibility of the optimal matching of the wave impedance provided by microstrip resonator systems of the present invention is promising for application in short millimeter and submillimeter wavelength ranges.

In spite of extremely high speed of electronic charge transfer processes in resonant tunneling nanostructures the achievement of terahertz frequencies in resonant tunneling diode based generators is rather difficult due to the problems in fabricating the high-Q three-dimensional confined cavity resonators for this wavelength range, as well as providing proper circuit conditions in interconnecting the external resonator and resonant tunneling diode. In particular, the waveguide systems, which are extremely effective in the microwave range cease to work at short millimeter and submillimeter wavelengths due to an increase of the energy losses in metallic elements. This results in a considerable decrease of the output power achieved in such systems at shorter wavelengths.

The microstrip resonators, being semi-open cavity systems and possessing an intermediate place between the three-dimensional confined cavity resonators and open resonators used in optics, have several advantages for use in shorter wavelength range. However, the efficiency of the use of a microstrip resonator in shorter wavelengths is determined in a considerable degree by the quality of the wave impedance matching of the active element and resonator. This is rather difficult to achieve when the active element and the resonator are fabricated separately. Since the microstrip resonators have as a rule a lower quality factor than the three-dimensional confined cavity resonators, it is very important to provide high electric parameters of the conductive microstrip lines and the dielectric layer.

The very urgent problem in expanding the generator frequency range towards the terahertz is the optimal connection of the resonant tunneling diode with external resonator. The present invention provides a solution of the problem using a combination in a single device of both an active element and a resonator.

So the most principal problems to be solved are:
the choice of the optimal design of the generator using high-speed quantum semiconductor heterostructures providing the optimal wave impedance matching of the active element and resonator as well as decreasing the parasitic inductance and optimizing parameters of electric circuitry in millimeter and submillimeter wavelength ranges;
the manufacturing of the device with the application of up-to-date technological techniques used in fabrication of quantum semiconductor heterostructures including molecular beam and thin-film epitaxy, photolithography and so on;
the achievement of a proper level of precision in fabricating the components of the generator including microstrip resonator;
the development of the multiplying technology of fabrication of the device including multiple generator units with the aim of increasing its output power and decreasing manufacturing costs; and/or
the development of methods of the integration of proposed generators as a planar elements into semiconductor integrated circuits.

The present invention is directed to solving the task of increasing the oscillation frequency of solid state microwave generator towards the terahertz frequency range. According to the present invention, elements of the generator device are manufactured using a monolithic integrated construction such that the elements are fabricated on a common substrate allowing the application of the methods of molecular beam epitaxy and thin-film epitaxy. The present invention may achieve:
the lowering of the parasitic inductance, the other parameters of electric circuitry;
the optimization of the wave impedance matching of the active element (resonant tunneling diode) and resonator system at short waves;
the increasing output power;
the reducing of the overall dimensions, the weight and the lowering manufacturing costs; and/or
the integration of proposed generators as a planar elements into semiconductor integrated circuits.

According to an aspect of the present invention, there is provided a microstrip stabilized quantum well resonance-tunneling generator of electromagnetic waves for millimeter and submillimeter wavelength range comprising: a resonant tunneling semiconductor quantum well diode; and a microstrip resonator. The resonant tunneling diode, the microstrip resonator and interconnecting lines and junctions may be fabricated as a monolithic integrated device on a common substrate.

The common substrate of the monolithic integrated device may be used as dielectric layer of the said microstrip resonator, having a conducting microstrip lines on one side and a grounded shield on another.

With the aim of improving the output power of the device, a series of resonant tunneling diodes connected with microstrip lines may be located on the same substrate in configuration providing the optimal phase relations for generated electromagnetic wave.

With the aim of decreasing the generation threshold and increasing the output power, the conducting microstrip lines as well as the grounded shield may be fabricated of superconductor material.

BRIEF DESCRIPTION OF THE DRAWINGS

The above objects and other features of the present invention will become more apparent by describing in detail exemplary embodiments thereof with reference to the attached drawings, in which.

DESCRIPTION OF THE EXEMPLARY EMBODIMENTS

Hereinafter, the present invention will be described in detail with reference to the drawings.

According to the present invention, a microstrip generator in monolithic integrated design comprises the resonant-tunneling diode structure with quantum wells and barriers, grown on semi-insulating substrate of GaAs, which is used simultaneously as a dielectric layer of the microstrip line. Both the resonant tunneling structure and the microstrip lines are fabricated using a common technological process including MBE growth of the layers of the structure and photolythographic formation of a resonant-tunneling diode, a microstrip resonator and interconnecting lines and contact junctions. The exemplary embodiments of the present invention are operable in a frequency range order of 300 GHz (wavelength of 1 mm).

Figure 1:
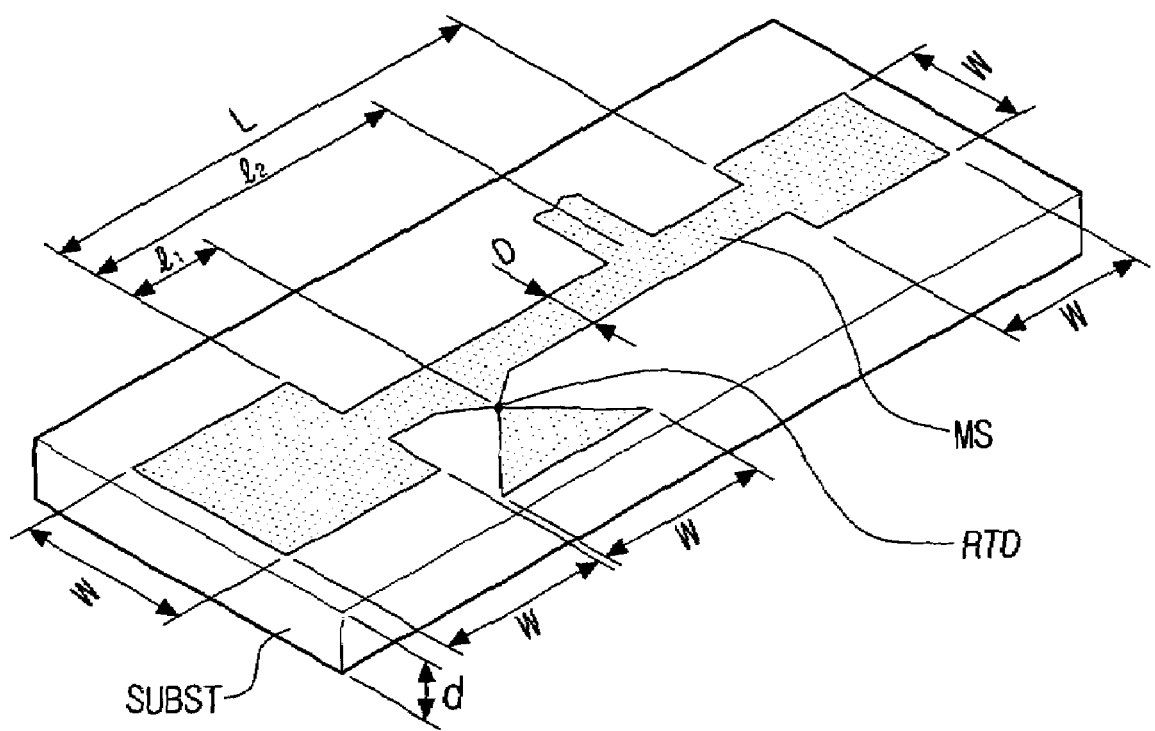
FIG. 1 is a view of a microstrip stabilized quantum-well resonance-tunneling generator for short millimeter wavelength range according to an exemplary embodiment of the present invention.

FIG. 1 is a view of a microstrip stabilized quantum-well resonance-tunneling generator for short millimeter wavelength range according to an exemplary embodiment of the present invention.

Referring to FIG. 1, the microstrip stabilized quantum-well resonance-tunneling generator comprises a resonant-tunneling diode RTD, a resonator microstrip line MS, a dielectric slab SUBST of the microstrip resonator which is also a substrate of the resonant-tunneling diode heterostructure, where L and D are a length and a width of the microstrip line MS, 11 is an interval between a microstrip resonator end and a microstrip diode stub, 12 is an interval between the microstrip resonator end and a microstrip output line, W is a width of an end capacitor and of the contact pads, and d is a thickness of the insulator slab SUBST of microstrip resonator.

The microstrip resonator is formed by deposition on the opposite sides of the dielectric layer metallic microstrips, wherein one side serves as a conducting microstrip line, while the other side (on the opposite side of the dielectric) serves as a grounded shield.

Figure 2A:
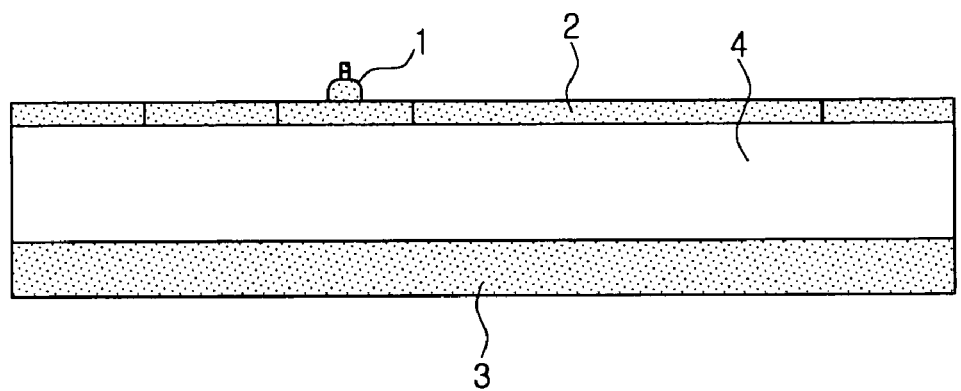
FIGS. 2A and 2B are a side view and a top view, respectively, of the microstrip stabilized generator of short millimeter wavelength with a resonant-tunneling diode according to an exemplary embodiment of the present invention.
Figure 2B:
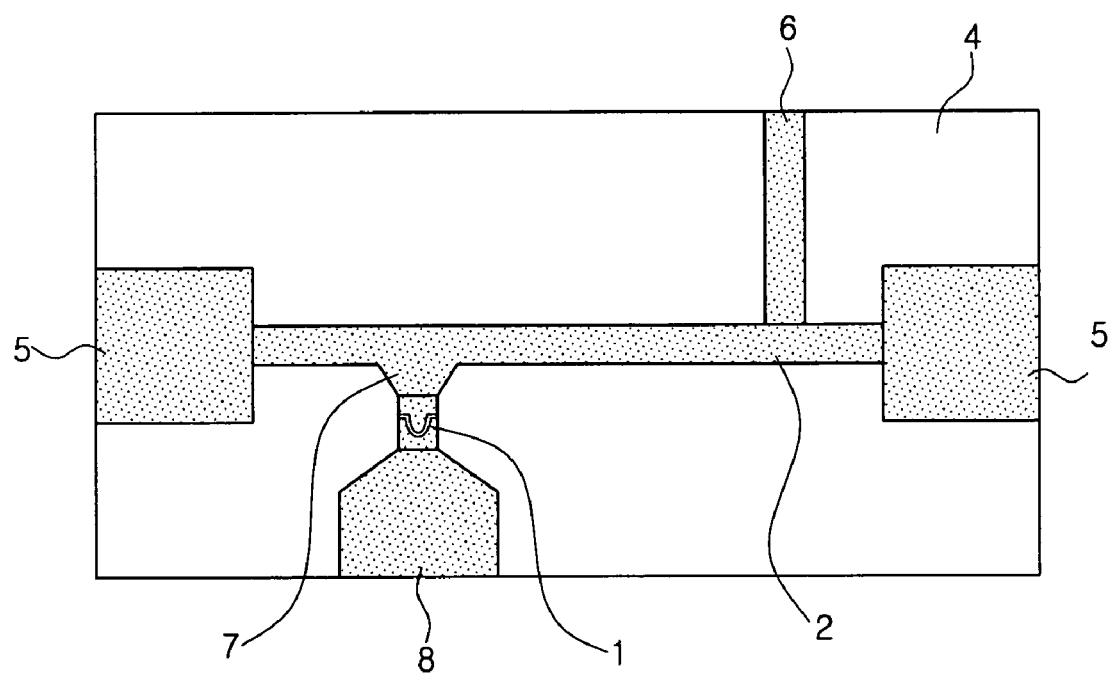

FIGS. 2A and 2B are a side view and a top view, respectively, of the microstrip stabilized generator of short millimeter wavelength with a resonant-tunneling diode according to an exemplary embodiment of the present invention.

Referring to FIGS. 2A and 2B, the microstrip stabilized generator comprises an active element area of a resonant-tunneling diode 1 with coplanar offset contact pads, a resonator microstrip line 2, a bottom grounded metallization layer 3, an insulator slab 4 of the microstrip resonator, an end capacitor and contact pads 5, an output microstrip line 6, a microstrip stub 7 for a diode biasing supply, and a contact pad 8 for diode biasing supply.

The microstrip line 2 of a one-half-wavelength type is patterned as a narrow conductor strip terminated at the both ends by the wide square pads 5, which serve as the series capacitors for microwaves, and one of the pads 5 is used as a DC bias voltage contact pad of the resonant tunneling diode 1. The resonant tunneling diode 1 is connected between the tapered sides of the stub 7 on the resonator microstrip line 2 and the tapered sides of the second bias voltage contact pad 8. The tapers decrease the parasitic inductance of the biasing lines. The second biasing contact pad 8 works simultaneously as a filter capacitor in the bias circuit. The tapered stub 7 of the microstrip line 2 is located near the square biasing contact pad 5 that corresponds to a partial loading the resonator by the resonant tunneling diode 1 and provides an optimal loaded quality factor of the resonator. The resonator microstrip line 2 and the bottom grounded metallization layer 3 may be fabricated of superconductor material.

Generated microwave power is output through the output microstrip line 6 located near the opposite end of the microstrip line 2. The width of a microstrip is much less than its length. A length L of the microstrip line 2 is equal to $\lambda/2\epsilon$, where $\epsilon$ is the high-frequency dielectric permittivity of the insulating layer of a microstrip resonator. For an oscillation frequency of 300 GHz, the microstrip length L equals 150 μm for $\epsilon=11$. Other dimensional parameters of the one-half-wave-type microstrip resonator, which stabilizes oscillations of the fundamental frequency, satisfy the following conditions:

$$D \ll L,\ d < D,\ D \ll W,\ 11 < L/2,\ L/2 < 12 < L.$$

Figure 3:
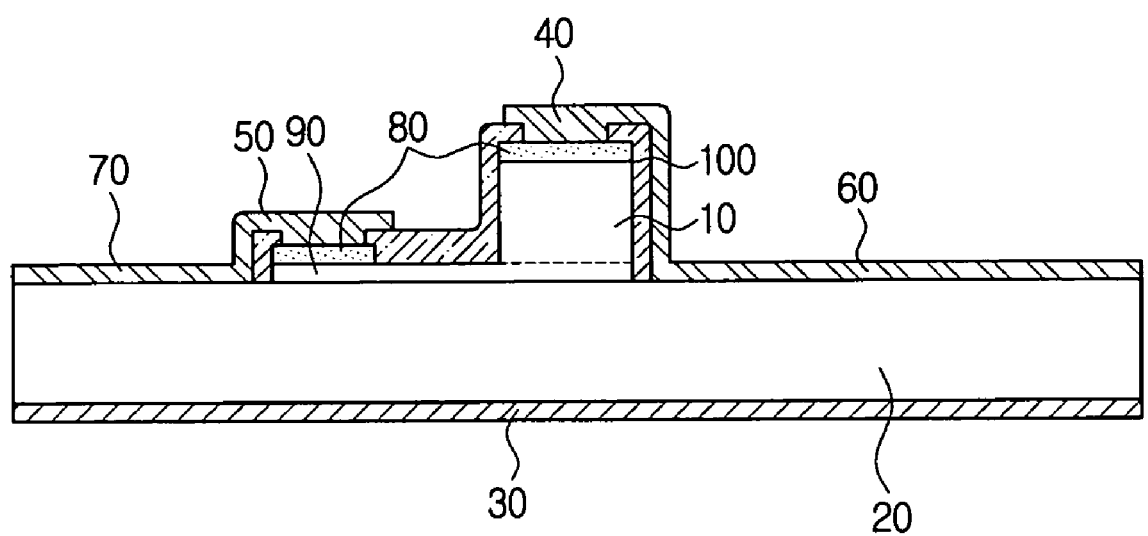
FIG. 3 is a sectional view of a resonant-tunneling diode active element with a coplanar contact system providing the connection with microstrip resonator according to an exemplary embodiment of the present invention.

FIG. 3 is a sectional view of a resonant-tunneling diode active element with a coplanar contact system providing the connection with microstrip resonator according to an exemplary embodiment of the present invention.

Referring to FIG. 3, a resonant-tunneling diode heterostructure 10 includes an insulator slab 20 of a microstrip resonator which is utilized as a resonant-tunneling heterostructure substrate, a bottom grounded metallization layer 30, a top contact 40, a bottom coplanar offset contact 50, internal ohmic contacts 80 heavily doped contact layer 90, and insulating diode heterostructure coverage layer 100. A contact pad 60 and a microstrip line stub 70 are connected to the internal ohmic contacts 80 for diode biasing supply.

The resonant tunneling diode is fabricated by molecular epitaxy and photolithography techniques on the semi-insulating gallium arsenide substrate and includes the spacer layers preventing the impurity segregation out of the heavily doped contact layers into the active quantum zone. The system of coplanar offset contact pads provides the minimum time delay in the negative differential conductivity (NDC) region of the current-voltage (I-V) curve. The contact areas are composed of the heavily doped gallium arsenide and of the Cr/Au ohmic contacts evaporated in a vacuum on the mesas less than 5 μm in diameter.

In the above exemplary embodiment, the size dimensions of the active area are approximately several microns. Such a low value in a combination with a short length of the lines connecting a resonator system and controllable resonator topology provides the minimum level of inductive and parasitic parameters and increases the operation frequency of the device.

As described above in a few exemplary embodiments of the present invention, monolithic integrated construction of the device provides the expansion of the operation frequency range toward the terahertz region as a result of the reduction of the parasitic inductance and minimizing the other parasitic parameters of the electric circuitry connecting the resonant tunneling diode and the microstrip resonator.

The use of high precision photolithographic techniques in fabrication of the device as a single integrated system including resonant tunneling diode mesostructures and microstrip resonator elements provides the necessary level of precision for generator elements that is important for short millimeter and submillimeter wave range in contrast with the case of non-integrated device fabrication methods.

A monolithic integrated multi-element high-frequency generator can be designed with several resonant tunneling diodes included into common microstrip line on a common dielectric substrate.

The design of the device of the present invention is compatible with multi-element planar integrated circuits and allows its incorporation into high-frequency integrated circuits.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A microstrip stabilized quantum well resonance-tunneling generator which generates electromagnetic waves of millimeter and submillimeter wavelength range, the generator comprising:

a common substrate;

a microstrip resonator; and a resonant tunneling semiconductor quantum well diode which comprises a first contact region formed on the microstrip resonator and a second contact region extendedly formed on a side of the microstrip resonator opposite the first contact region, wherein the resonant tunneling diode, the microstrip resonator and interconnecting lines and junctions are fabricated as a monolithic integrated device on the common substrate; and a top contact and a bottom offset contact are asymmetric with regard to a mesa of the resonant tunneling semiconductor quantum well diode.

2. The generator of claim 1, wherein the common substrate is a dielectric layer of the microstrip resonator, and conducting microstrip lines of the microstrip resonator and a grounded shield layer are disposed on opposite sides of the common substrate.

3. The generator of claim 2, wherein the microstrip line and the grounded shield layer are fabricated of superconductor material.

4. The generator of claim 1, wherein the microstrip resonator comprises a microstrip line having a tapered stub connected to the resonant tunneling semiconductor quantum well diode.

5. The generator of claim 4, further comprising first and second contact pads provided at opposite ends of the microstrip line which serve as series capacitors.

6. The generator of claim 5, further comprising a bias voltage contact pad having tapered sides, wherein resonant tunneling semiconductor quantum well diode is connected between the stub of the microstrip line and the bias voltage contact pad.

* * * * *